(12) United States Patent
Syed et al.

(10) Patent No.: US 7,779,318 B2
(45) Date of Patent: Aug. 17, 2010

(54) SELF TEST STRUCTURE FOR INTERCONNECT AND LOGIC ELEMENT TESTING IN PROGRAMMABLE DEVICES

(76) Inventors: Danish Hasan Syed, b-99/1, Shaheen Bagh, Abul Fazal Enclave II, Okhla, New Delhi - 110 025 (IN); Vishal Kumar Srivastava, House No. 185, Sector-14, Lucknow 2266016, UP (IN)

( * ) Notice: Subject to any disclaimer, the term of this patent is extended or adjusted under 35 U.S.C. 154(b) by 682 days.

(21) Appl. No.: 11/318,347

(22) Filed: Dec. 23, 2005

(65) Prior Publication Data

US 2007/0011539 A1    Jan. 11, 2007

(30) Foreign Application Priority Data

Dec. 27, 2004   (IN)   .................. 2572/DEL/2004

(51) Int. Cl.
*G01R 31/28*   (2006.01)
*G06F 11/00*   (2006.01)

(52) U.S. Cl. .................. 714/725; 714/726; 714/30

(58) Field of Classification Search .............. None
See application file for complete search history.

(56) References Cited

U.S. PATENT DOCUMENTS

| 5,550,843 | A | 8/1996 | Yee | |
|---|---|---|---|---|
| 6,968,487 | B1 * | 11/2005 | Bryant et al. | 714/726 |
| 7,373,567 | B2 * | 5/2008 | Cohn et al. | 714/725 |

* cited by examiner

*Primary Examiner*—Christine T Tu

(57) ABSTRACT

A self test structure for interconnect and logic element testing in programmable devices including a plurality of logic elements; an interconnect structure for connecting the logic elements; SRAM based configuration latches for configuring the interconnect structure; test configuration circuitry for configuring any desired set of logic elements, interconnect structure and configuration latches during reset state that links the logic elements and interconnect structure to form a complete path between the interface points of the programmable logic device to enable testing of the desired elements in the complete path.

23 Claims, 5 Drawing Sheets

SELF TEST STRUCTURE FOR INTERCONNECT AND LOGIC ELEMENT TESTING IN PROGRAMMABLE DEVICES

BACKGROUND

Testing of programmable logic such as Field Programmable Gate Arrays (FPGA) is a very complex task because all logic elements (configuration latches and programmable resources combined) can attain mind-boggling logic combinations requiring huge amount of test-vectors to test them. So Design For Testability (DFT) designers usually adopt a combination of ad hoc and traditional approaches for achieving maximum testability. Any DFT technique, which helps to determine device status at silicon without much of tester's time, is highly desirable.

Generally a Linear Feedback Shift Register (LFSR) is used for generating a particular signature, which verifies a device's functionality to some extent. An LFSR is a sequential shift register with combinational logic that causes it to pseudo-randomly cycle through a sequence of binary values.

FIG. 1 reproduces FIG. 2 of U.S. Pat. No. 5,550,843 by Wilson K. Yee entitled 'Programmable Scan Chain Testing Structure And Method'. The above-mentioned circuit comprises a programmable multiplexer for sequentially connecting columns of logic cells to enable the configuring of logic cell columns into one or more scan chains. Each column of logic cells contain an edge cell comprising a multi-input multiplexer, one of the multiplexer inputs being dedicated to receiving a signal from an adjacent cell, other inputs being connected to gate array input pads. A programmable control signal on the multiplexer enables the column to either receive test data from one of the gate array input pads or to connect as part of a scan chain by receiving a wrapping signal from the output logic cell of an adjacent column.

The aforesaid prior art solves a major testing issue of FPGAs and other programmable devices, but the cost paid in terms of silicon hardware is too expensive. For each logic cell cluster, the above patent proposes to have dedicated scan multiplexers and routing resources. Seeing the complexity and size of today's FPGAs, the number of such multiplexers will grow drastically which would further occupy valuable silicon space. Furthermore, the testing hardware, causing increased size, is never used by an actual user application. As small size and low power are a key universal selling point for today's electronic products in general and FPGAs in particular, the prior art looses its significance.

The testability offered by the aforesaid US patent covers only the logic portion and not the routing, which takes around 80% of total silicon size, and is hence more susceptible to failure.

Another drawback is that it is highly dependent on the correctness of EDA software tool set. As the programmable scan chain is activated through proper configuration of latches done using FPGA software and hardware, any small problem in setup may lead to wrong results.

Thus the major problem faced while testing an FPGA chip is its heavy dependency on system EDA software. Neither results/outputs can be expected nor inputs can be applied to the FPGA unless the Input/Output Block IOs and Logic blocks are programmed. This system proposes to remove this dependency of testing from software and yet give initial health check of the device on reset state of configuration latches. The implemented logic will help generate pseudo-random sequences without any need for user to program configuration latches.

SUMMARY

Various embodiments provide scan chains for testability by using existing device architectural resources.

Some embodiments use said testability by using reset state configuration bits.

Some embodiments provide a software independent solution that verifies logic blocks as well as the routing paths.

Various embodiments provide a self-test structure for interconnect and logic element testing in a programmable logic device comprising:

a plurality of logic elements;

an interconnect structure for connecting the logic elements;

SRAM based configuration latches for configuring the interconnect structure; and test configuration means for configuring a desired set of desired logic elements, a desired interconnect structure, and desired configuration latches during a reset state by linking the desired logic elements and interconnect structure to form a complete path between interface points of the self-test structure to enable testing of the desired logic elements in the complete path.

In some embodiments, the configuration latches associated with logic elements and interconnect structure other than the desired logic elements and the desired interconnect structure are not configured.

In some embodiments, the programmable logic device is configured to logic zero at the time of reset.

In some embodiments, the programmable logic device includes an FPGA.

In some embodiments, the FPGA includes look-up tables (LUTs).

In some embodiments, the LUT in a logic element implements XOR functionality.

Various embodiments provide a method for testing a self-test structure comprising:

resetting logic elements and configuration latches on the self-test structure;

configuring the logic elements and configuration latches with a logic zero value;

programming a desired set of logic elements, interconnect structure and configuration latches in the reset state; and concatenating said desired set of logic elements to form a complete path, thereby enabling testing of said desired elements in said complete path.

BRIEF DESCRIPTION OF THE ACCOMPANYING DRAWINGS

The invention will now be described with reference to the accompanying drawings:

FIG. 1 shows the invention in accordance with the U.S. Pat. No. 5,550,843.

DETAILED DESCRIPTION

Figure 1:
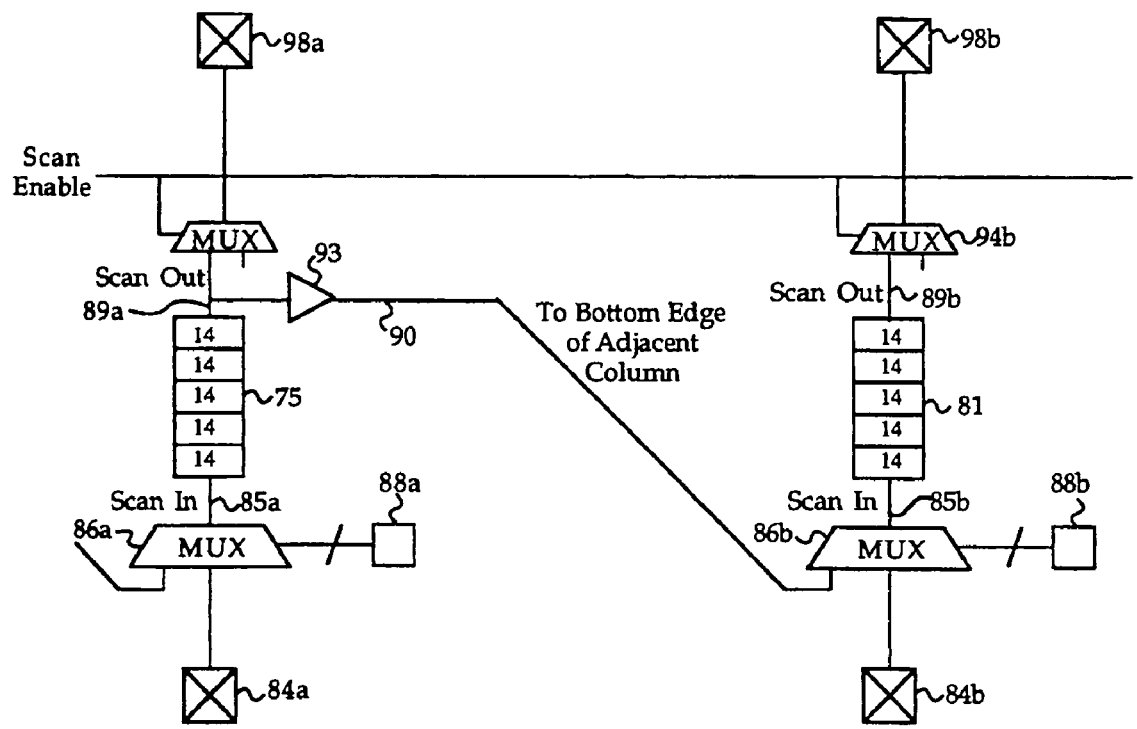
Figure 2:
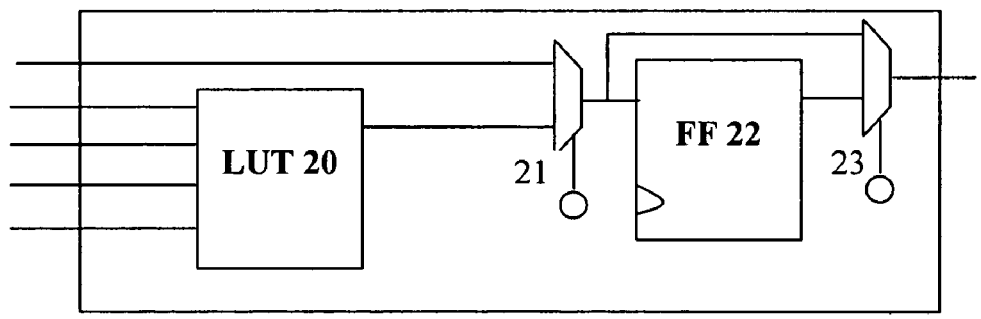
FIG. 2 shows a logic element of FPGA.
Figure 3:
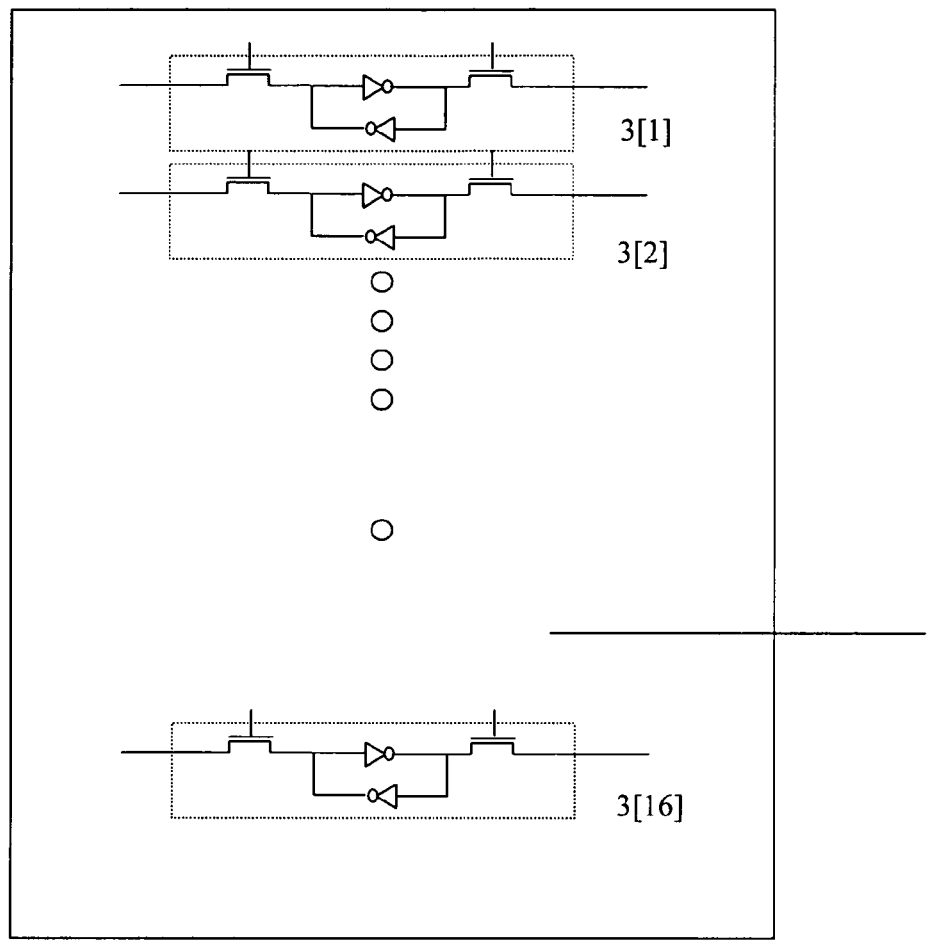
FIG. 3 shows the structure of a LUT.

FIG. 2 shows a generic diagram of an FPGA having a LUT 20, a flip-flop 23 and multiplexers 21, 23 that can support a register-packing mode. This is collectively referred to as a logic element of the FPGA. The LUTs in a logic element are SRAM based. The architecture of an LUT 20 is as shown in FIG. 3. It comprises 16 6T-SRAM cells 3[1:16].

Figure 4:
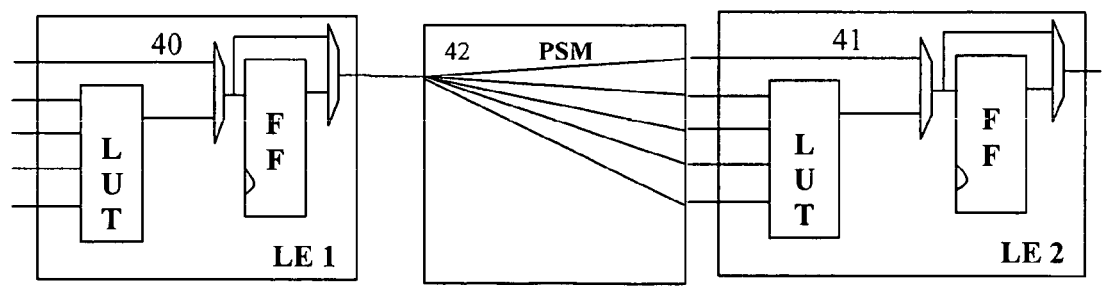
FIG. 4 shows the connectivity between the logic elements.

An FPGA structure contains numerous logic elements, which are interconnected to each other. FIG. 4 broadly shows such an arrangement. The logic elements 40 and 41 are connected to each other through Programmable Switch Matrix (PSM) 42 controlled by 6T-SRAM cells/configuration latches. The PSM 42 connects the output of one logic element to another once it is configured.

The invention proposes to implement some logical circuits at the time of INITIAL RESET by intelligent implementation of configuration latches. Before configuring the same, all the configuration latches are RESET to an initial value ZERO.

Figure 5:
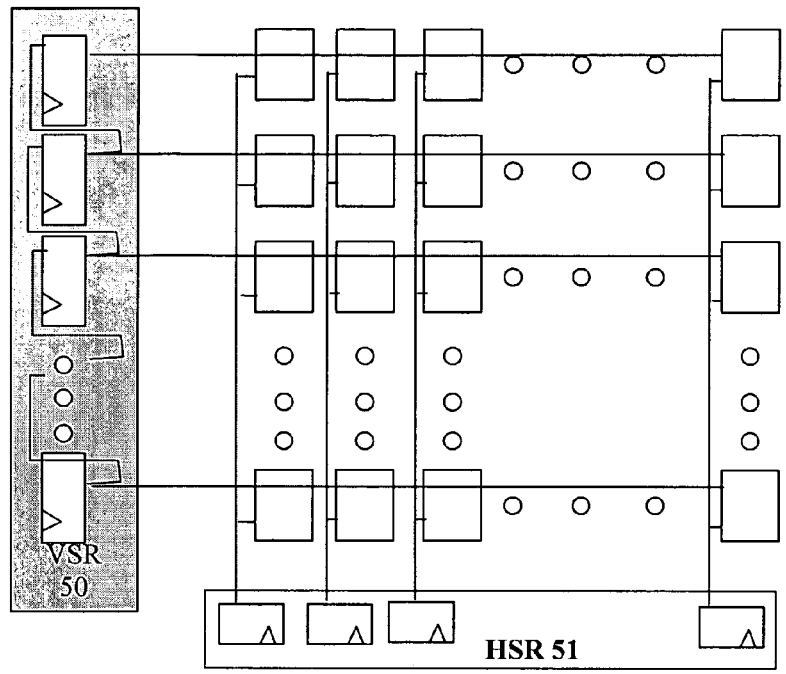
FIG. 5 shows the arrangement of latches in FPGA.

FIG. 5 shows the structure used for storing a value in configuration latches. It comprises a Vertical Shift Register (VSR) 50, a Horizontal Shift Register (HSR) 51 and a plurality of latches. To store the zeros in the configuration latches, a sequence of zeros is stored in VSR 50. Then the plurality of latches is enabled column by column using HSR 51. Once zeros are stored in the configuration latches at the reset, the desired functionality bits are stored in the configuration latches.

Once the configuration latches are reset, they can implement

A LSFR chains inside the device.

A shift register using LUTs as feed-through or

A shift register using direct connection to Flip-flops.

Figure 6:
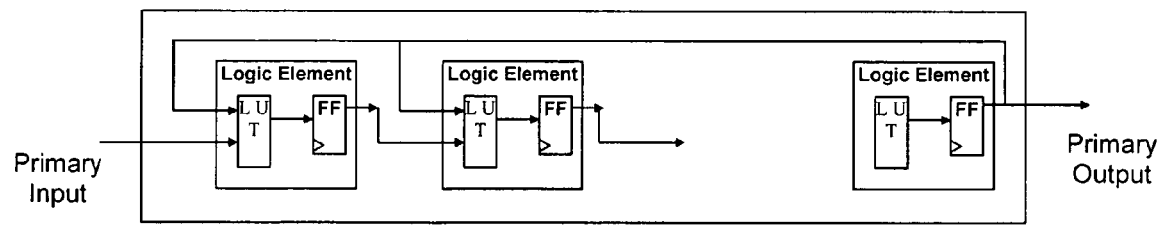
FIG. 6 shows the connections between logic elements in the reset state.

FIG. 6 shows the connections between logic elements once they are configured in the reset state. The reset state positioning of configuration latches ensures that above mentioned connections are made at the time of initial reset. Furthermore, the reset state configuration (all zeros) inside an LUT implements an XOR gate instead of logic 0. This is done by making some minor modifications in LUT structure as shown in FIG. 7.

Figure 7:
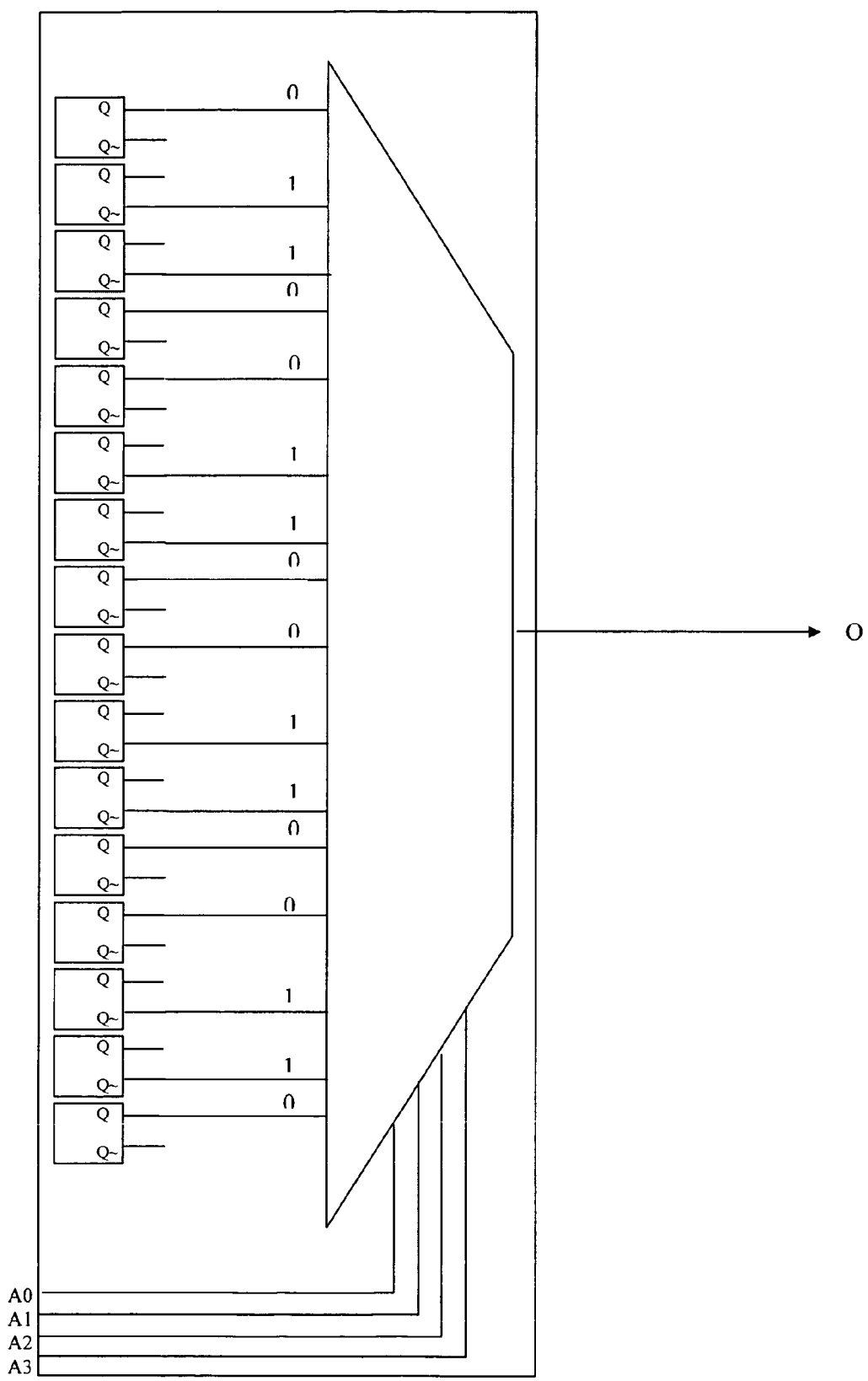
FIG. 7 shows a normal LUT implementation using SRAM Latches and multiplexers.

FIG. 7 shows a normal LUT implementation using SRAM Latches and multiplexers. The new connectivity of latches to output multiplexers are incorporated by making some software changes. However the changes made are trivial.

A Reset state also ensures that these chains have their input and output available as primary input/output at the tester. The LSFR chains are made by concatenating identical logic units (an LUT and a FF). The LUT in a logic element implements XOR functionality and forwards the output to the flip-flop present in the same logic element. The routing resources are also programmed as the connections between the logic elements are made in the reset state. Thus the desired complete path between the logic elements is formed to allow the routing resources to keep the un-required connections open.

Figure 8:
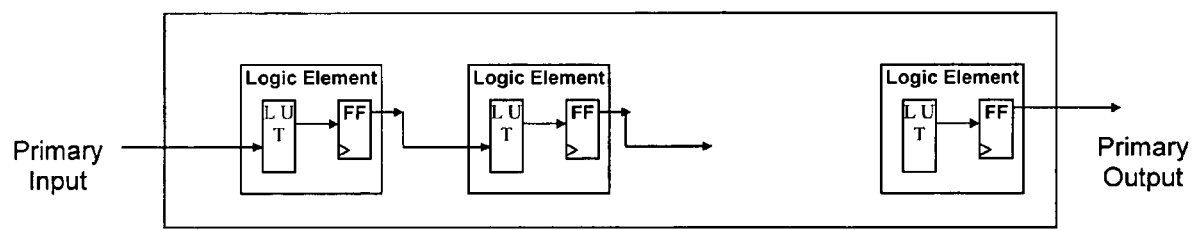
FIG. 8 shows another embodiment in accordance with the invention.

FIG. 8 shows another embodiment detailing a feed through path. By slightly changing the connectivity of the configuration latches and output multiplexer of FIG. 7, a feed through can be implemented in LUTs. The flip-flops can be connected again to form a shift register as shown in FIG. 8.

Thus the problem of increased silicon size is tackled by using existing device architecture resources for making a scan chain. As explained in FIGS. 6 AND 7, the proposed invention utilizes the existing flip-flops and LUT for implementing a similar scan chain for testability purpose using Reset State configuration bits. Hence it is quite economical in terms of silicon area.

The invention not only tests the Logic portion, but also checks user routing paths. As the scan chains use same user routing as users application, so while testing Logic, the user routing is automatically tested. This also further reduces any extra overhead due to scan chain routing while at same time increasing tests coverage of the architecture.

As the invention never involves any software support, the device initial tests can be made independent of FPGA software and hardware for configuration. The invention uses an intelligent use of reset state of configuration latches to make necessary connections.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A self-test structure for interconnect and logic element testing in a programmable logic device, comprising:

a plurality of logic elements, each of the plurality of logic elements comprising at least one look-up table (LUT) and at least one flip-flop;

an interconnect structure that includes a programmable switch matrix for connecting the logic elements;

SRAM-based configuration latches for configuring the interconnect structure; and test configuration means for configuring a set of one or more of the plurality of logic elements, a portion of the interconnect structure, and one or more of the configuration latches during a reset state by linking the one or more logic elements, the portion of the interconnect structure, and the one or more configuration latches to form a complete path between interface points of the self-test structure to enable testing of the one or more logic elements, the portion of the interconnect structure, and the one or more configuration latches in the complete path, and testing the one or more logic elements, the testing of the one or more logic elements automatically testing the portion of the interconnect structure.

2. The self-test structure of claim 1, wherein the plurality of logic elements other than the one or more logic elements, the interconnect structure other than the portion of the interconnect structure, and the configuration latches other than the one or more configuration latches are not configured.

3. The self-test structure of claim 1, wherein the one or more configuration latches are configured to logic zero at the time of reset.

4. The self-test structure of claim 1, wherein the self-test structure includes a field programmable gate array (FPGA).

5. The self-test structure of claim 4, wherein the FPGA includes look-up tables (LUTs).

6. The self-test structure of claim 5, wherein the LUTs implement XOR functionality.

7. The self-test structure of claim 1, wherein each of the plurality of logic elements further comprises at least one multiplexer.

8. The self-test structure of claim 1, wherein the test configuration means is configured to test the set of the one or more logic elements, the portion of the interconnect structure, and the one or more configuration latches without using software.

9. The self-test structure of claim 1, wherein the set of one or more logic elements, the portion of the interconnect structure, and the one or more configuration latches comprise existing resources on the self-test structure.

10. A method for testing a self-test structure, comprising:
resetting logic elements and configuration latches on the self-test structure, each of the logic elements comprising at least one look-up table (LUT) and at least one flip-flop;
configuring the logic elements and configuration latches with a logic zero value;
programming a set of one or more of the logic elements, a portion of an interconnect structure that includes a programmable switch matrix that is configured to connect the logic elements, and one or more of the configuration latches; and
concatenating the set of the one or more logic elements, the portion of the interconnect structure, and the one or more configuration latches to form a complete path, thereby enabling testing of the one or more logic elements, the portion of the interconnect structure, and the one or more configuration latches in the complete path.

11. The method of claim 10, further comprising testing the one or more logic elements in the complete path.

12. The method of claim 11, wherein the testing of the one or more logic elements in the complete path automatically tests the portion of the interconnect structure.

13. The method of claim 10, further comprising testing the set of the one or more logic elements, the portion of the interconnect structure, and the one or more configuration latches in the complete path without using software.

14. The method of claim 10, wherein the set of the one or more logic elements, the portion of the interconnect structure, and the one or more configuration latches comprise existing resources on the self-test structure.

15. A method for testing a field programmable gate array (FPGA) structure comprising:
connecting a plurality of logic elements together on the FPGA structure using an interconnect structure that includes a programmable switch matrix and routing lines, each of the plurality of logic elements comprising at least one look-up table (LUT) and at least one flip-flop; and
testing the plurality of logic elements, the testing of the plurality of logic elements automatically testing the routing lines.

16. The method of claim 15, wherein the purality of logic elements and the routing lines are tested without software support.

17. The method of claim 15, wherein the purality of logic elements and the routing lines comprise existing resources on the FPGA structure.

18. The method of claim 15, wherein the FPGA structure is configured to logic zero prior to the testing.

19. The method of claim 15, wherein the at least one LUT implements XOR functionality.

20. A self-test structure for interconnect and logic element testing in a programmable logic device, comprising:
a plurality of logic elements, each of the plurality of logic elements comprising at least one look-up table (LUT) and at least one flip-flop;
an interconnect structure that includes a programmable switch matrix controlled by configuration latches; and
the programmable switch matrix configured to connect a set of one or more of the plurality of logic elements, a portion of the interconnect structure, and one or more of the configuration latches to form a complete path between interface points of the self-test structure to enable testing of the one or more logic elements, the portion of the interconnect structure, and the one or more configuration latches in the complete path, wherein testing the one or more logic elements and the one or more configuration latches automatically tests the portion of the interconnect structure.

21. The self-test structure of claim 20, wherein each of the plurality of logic elements further comprises at least one multiplexer.

22. The self-test structure of claim 20, wherein the self-test structure is configured to test the set of the one or more logic elements, the portion of the interconnect structure, and the one or more configuration latches without using software.

23. The self-test structure of claim 20, wherein the set of one or more logic elements, the portion of the interconnect structure, and the one or more configuration latches comprise existing resources on the self-test structure.

* * * * *

UNITED STATES PATENT AND TRADEMARK OFFICE
CERTIFICATE OF CORRECTION

PATENT NO. : 7,779,318 B2  Page 1 of 1
APPLICATION NO. : 11/318347
DATED : August 17, 2010
INVENTOR(S) : Danish Hasan Syed et al.

It is certified that error appears in the above-identified patent and that said Letters Patent is hereby corrected as shown below:

In column 6, line 4, in Claim 16, delete "purality" and insert -- plurality --, therefor.

In column 6, line 7, in Claim 17, delete "purality" and insert -- plurality --, therefor.

Signed and Sealed this

Twenty-first Day of December, 2010

David J. Kappos
*Director of the United States Patent and Trademark Office*